United States Patent
Kim et al.

(10) Patent No.: US 6,347,053 B1
(45) Date of Patent: Feb. 12, 2002

(54) NONVIOLATILE MEMORY DEVICE HAVING IMPROVED THRESHOLD VOLTAGES IN ERASING AND PROGRAMMING OPERATIONS

(75) Inventors: Jong-han Kim, Sungnam; Jeong-hyuk Choi, Suwon, both of (KR)

(73) Assignee: Samsung Electronics Co., Ltd. (JP)

( * ) Notice: Subject to any disclaimer, the term of this patent is extended or adjusted under 35 U.S.C. 154(b) by 0 days.

(21) Appl. No.: 09/491,840

(22) Filed: Jan. 26, 2000

(30) Foreign Application Priority Data

Jan. 26, 1999 (KR) .............................................. 99-2403

(51) Int. Cl.$^7$ .............................................. G11C 16/04
(52) U.S. Cl. ........................... 365/185.24; 365/185.28; 365/185.29
(58) Field of Search ........................ 365/185.24, 185.26, 365/185.27, 185.28, 185.29, 185.33, 185.19

(56) References Cited

U.S. PATENT DOCUMENTS

| | | | | |
|---|---|---|---|---|
| 5,416,738 A | * | 5/1995 | Shrivastava .................. | 365/185 |
| 5,694,357 A | * | 12/1997 | Mori ..................... | 365/185.03 |
| 6,064,597 A | * | 5/2000 | Takeshima et al. .... | 365/185.24 |
| 6,154,931 A | * | 11/2000 | Takeuchi et al. ....... | 365/185.24 |
| 6,198,662 B1 | * | 3/2001 | Chen et al. ............ | 365/185.29 |

FOREIGN PATENT DOCUMENTS

KR        96-43249        12/1996

OTHER PUBLICATIONS

IEEE EDL Electron Device Letters, Degradations Due to Hole Trapping in Flash Memory Cells, vol. 10, No. 3, pp. 117–119, dated Mar. 1993.
IEEE Proceedings of the IEEE, Reliability Issues of Flash Memory Cells, vol. 81, No. 5, pp. 776–788, dated May 1993.
IEDM Tech. Digest, a Single Transistor EEPROM Cell and Its Implementation in a 512K CMOS EEPROM, pp. 616–619, dated 1985.

* cited by examiner

Primary Examiner—Richard Elms
Assistant Examiner—Hien Nguyen
(74) Attorney, Agent, or Firm—Cantor Colburn LLP

(57) ABSTRACT

A nonvolatile memory device having a predetermined threshold voltage is disclosed. In the nonvolatile memory device comprising a gate electrode including a control gate, a floating gate and a gate insulating layer, a source region and a drain region, a threshold voltage of an initial state applied to a word line such that the floating gate is electrically neutral is set to the mean value between the threshold voltage of a programmed state and the threshold voltage of an erased state. Thus, the amount of negative charges passing through a tunnel oxide layer during a program operation is the same as the amount of positive charges passing through the tunnel oxide layer during an erase operation, and an electric field formed on the tunnel oxide layer is minimized. Thus, the generation of electron traps in the tunnel oxide layer is reduced even though the program or erase operations are repeated, to thereby suppress the loss of the charges stored in the floating gate. As a result, the reliability of the device can be enhanced.

8 Claims, 4 Drawing Sheets

NONVIOLATILE MEMORY DEVICE HAVING IMPROVED THRESHOLD VOLTAGES IN ERASING AND PROGRAMMING OPERATIONS

BACKGROUND OF THE INVENTION

1. Field of the Invention

The present invention relates to a nonvolatile memory device, and more particularly, to the nonvolatile memory device in which setting of a threshold voltage is improved.

2. Description of the Related Art

An EEPROM, which is a nonvolatile memory device capable of electrically erasing a selected unit cell, includes a gate electrode obtained by sequentially stacking a tunnel oxide layer, a floating gate, an interdielectric layer and a control gate, and a source and drain region on a semiconductor substrate. A conventional EEPROM is electrically programmed or erased by injecting hot electrons into a floating gate through a tunnel oxide layer, or removing the hot electrons injected into the floating gate. However, when a program operation and an erasure operation are repeated, the tunnel oxide layer is deteriorated by electron trap, and reliability of the device is lowered.

FIG. 1 shows threshold voltages of the conventional EEPROM in an initial state, an erased state and a programmed state. In the conventional EEPROM of FIG. 1, the threshold voltage 120 in the initial state is approximately 2.5V, the threshold voltage 100 in the erased state is approximately 2V, and the threshold voltage 110 in the programmed state is approximately 6V.

So as to program the selected unit cell of the EEPROM, hot electrons need to be injected into the floating gate of the unit cell in the initial state so that the threshold voltage of the unit cell can be increased to the order of 6V, and so as to erase the programmed unit cell of the EEPROM, the hot electrons injected into the floating gate of the unit cell during the program operation need to be removed so that the threshold voltage of the unit cell can be reduced to the order 2V. Therefore, when the unit cell in the initial state is programmed, the amount (b) of a change of the threshold voltage is 3.5V, and when the programmed unit cell is erased, the amount (a+b) of a change of the threshold voltage is 4V. This means that many electrons must be injected into or removed from the floating gate through the tunnel oxide layer. However, if the amount of electrons passing through the floating gate is excessive, the tunnel oxide layer can be deteriorated due to electron trap. Also, an increase in the amount of electrons injected into the floating gate causes an additional strong electric field in addition to an external electric field applied to program the unit cell, so that the reliability of EEPROM may be lowered.

Meanwhile, the reliability of the EEPROM relates to the electron retention capability of the floating gate. However, in the case that the tunnel oxide layer is deteriorated due to excessive electron passing through as mentioned above, the electrons stored in the floating gate leak. As a result of this leaking phenomenon, the threshold voltage in the programmed state changes such that the reliability of EEPROM can be lowered.

SUMMARY OF THE INVENTION

To solve the above problem, it is an objective of the present invention to provide a nonvolatile memory device for minimizing the electric field due to the amount of charges stored in a floating gate during a program operation or an erase operation, without damaging a tunnel oxide layer. This results in the reliability of a device being enhanced.

According to an aspect of the present invention to achieve the above objective, in a nonvolatile memory device having a gate electrode obtained by sequentially stacking a gate insulating layer, a floating gate, an interdielectric layer and a control gate, a source region and a drain region, wherein the threshold voltage of an initial state, in which the floating gate is electrically neutral, is set to the mean value between the threshold voltage of a programmed state and the threshold voltage of an erased state. Here, the threshold voltage of the programmed state is 6V, the threshold voltage of the erased state is 2V, and the threshold voltage of the initial state is 3.5~4.5V. Also, the threshold voltage of the initial state is set to a desired value by implanting an impurity into a region where a channel is formed. The nonvolatile memory device is a flash memory, and hot electrons are injected into the floating gate to program the nonvolatile memory device, and the electrons stored in the floating gate are tunneled to erase the nonvolatile memory device.

According to another aspect of the present invention, in a nonvolatile memory device having a gate electrode obtained by sequentially stacking a gate insulating layer, a floating gate, an interdielectric layer and control gate, a source region and a drain region, wherein the threshold voltage of an initial state, in which the floating gate is electrically neutral, is the same as a voltage applied to a word line to read the data stored in the nonvolatile memory device. Here, the nonvolatile memory device is a flash memory. Also, hot electrons are injected into the floating gate to program the nonvolatile memory device, and the electrons stored in the floating gate are tunneled to erase the memory device.

According to the present invention, the threshold voltage in the initial state is set to the mean value between the threshold voltage in a programmed state and the threshold voltage in an erased state, so that the amount of negative charges passing through a tunnel oxide layer during a program operation is the same as the amount of positive charges passing through the tunnel oxide layer during an erase operation, to reduce generation of electron traps in the tunnel oxide layer. Also, the amount of electrons stored in the floating gate during a program and an erase operation is minimized, to thereby suppress the loss of the charges due to external conditions. As a result, the reliability of the device is enhanced.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
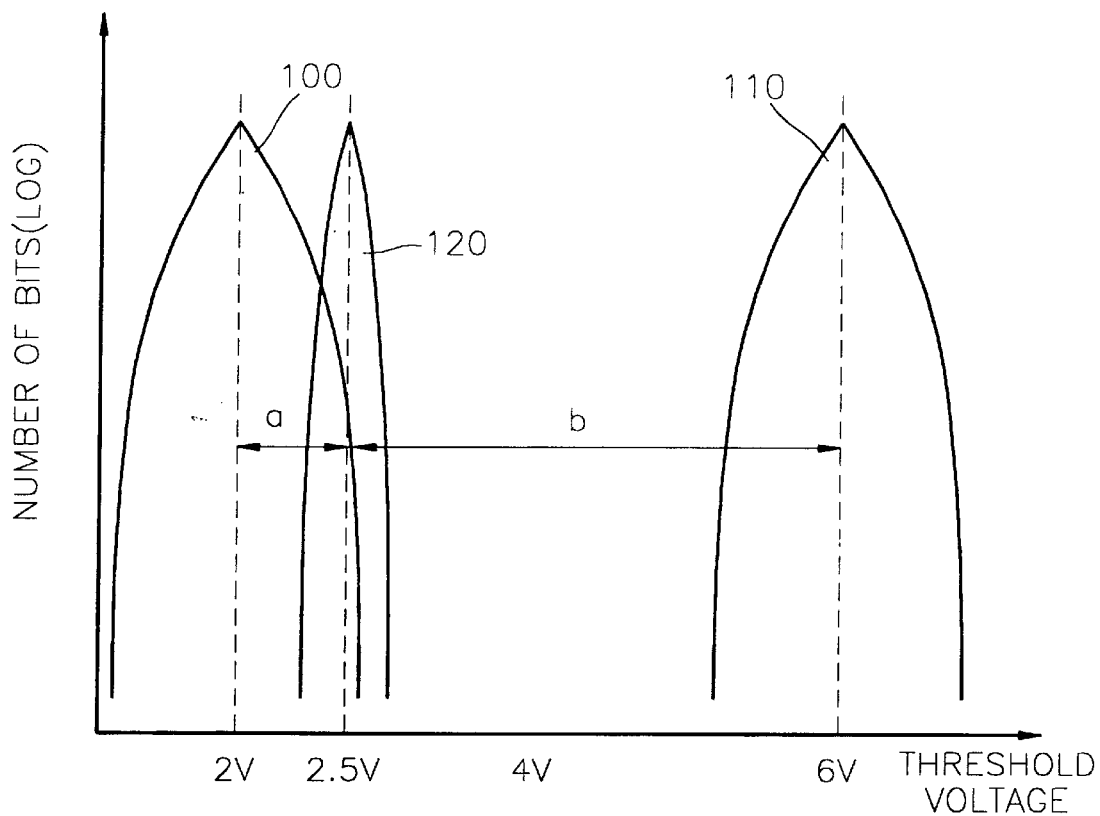
FIG. 1 is a graph showing the distribution of the values of the threshold voltages in a initial state, a programmed state and an erased state in a conventional nonvolatile memory device.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Embodiment 1

Figure 2:
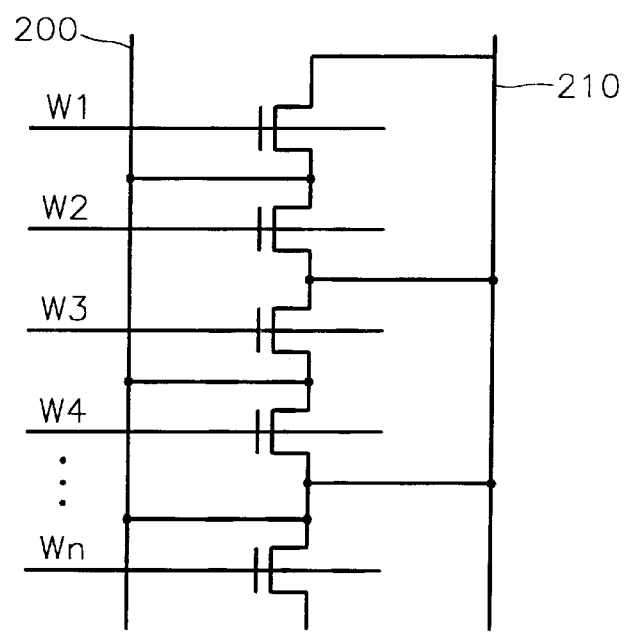
FIG. 2 is a layout showing a typical NOR flash memory.

Referring to FIG. 2 showing a layout of a NOR flash memory embodied by the present invention, reference numeral 200 denotes a bit line connected to drain regions, reference numeral 210 denotes a source line connected to source regions, and reference characters W1 to Wn denote word lines connected to gate electrodes.

Referring to FIG.2, in a flash memory capable of electrically storing and erasing data, a unit cell is formed in a region where a bit line and a word line are intersected. Also, two unit cells are connected to the bit line using a common bit line contact. Also, the source regions are connected to the source line which is parallel with the bit line.

Figure 3:
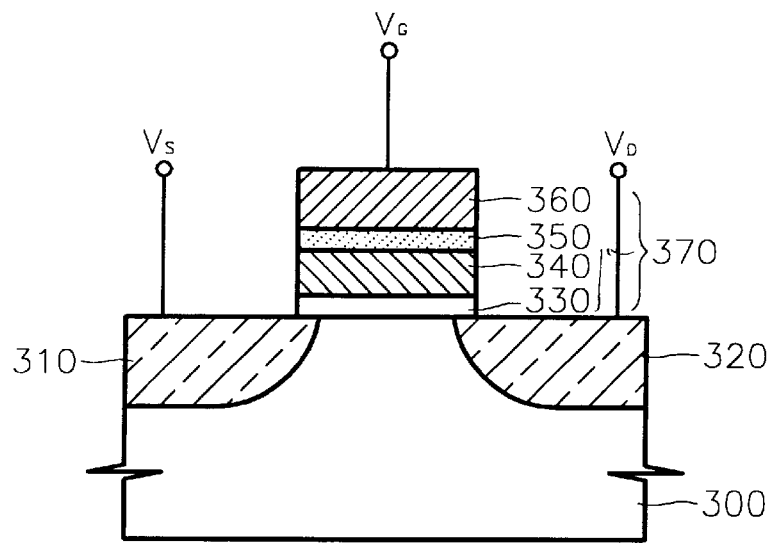
FIG. 3 is a cross sectional view of a typical nonvolatile memory device.

Referring to FIG. 3 showing a unit cell of a NOR flash memory embodied by the present invention, the unit cell having a source region 310, a drain region 320 and a gate electrode 370 obtained by sequentially stacking a tunnel oxide layer 330, a floating gate 340, an interdielectric layer 350 and a control gate 360 on a semiconductor substrate 300.

The operation of the NOR flash memory cell will now be described as follows. In order to program a memory cell, the voltages of 6V~7V, 10V~12V and 0V are applied to the bit line connected to the drain region 320, the word line connected to the control gate 360 and the source line connected to the source region 310 and the semiconductor substrate 300, respectively. As a result, a channel is formed on a surface of the semiconductor substrate 300 under the floating gate 340, and current flows from the drain region 320 to the source region 310 through the channel. At this time, hot electrons having high energy are generated from a depletion region of the drain region 320. A part of the generated hot electrons pass through the region of the tunnel oxide layer 330 where the drain region 320 and the floating gate 340 overlap and the electrons are injected into the floating gate 340. The hot electrons injected into the floating gate 340 are then stored in the floating gate 340, so that they increase the threshold voltage of the memory cell to the extent that the memory cell can be programmed. The amount of charges to be stored in the floating gate 340 so that the memory cell can be programmed into the required threshold voltage, expressed by Formula 1.

$$Q = C_{ONO} \times \Delta V_{th} \quad \text{(Formula 1)}$$

Here, Q denotes the amount of charges to be stored in the floating gate 340 during a program operation, $C_{ONO}$ denotes capacitance of an ONO layer which is an interdielectric layer 350, and $\Delta V_{th}$ denotes the difference between the threshold voltage of the initial state and that of the program state. Here, $C_{ONO}$ is expressed by Formula 2.

$$C_{ONO} = \in A / d_{ONO} \quad \text{(Formula 2)}$$

Here, $\in$ denotes the effective dielectric constant of the ONO layer, A denotes the area of the ONO layer, and $d_{ONO}$ denotes the effective thickness of the ONO layer.

Considering Formula 1, it can be easily known that the increase of $\Delta V_{th}$ results in the increase of Q, which is the amount of charges stored in the floating gate, and the decrease of $\Delta V_{th}$ results in the decrease of Q. Therefore, this invention intentionally reduces $\Delta V_{th}$ so that the amount of charges Q stored in the floating gate 340 can be decreased (the detailed condition of $\Delta V_{th}$ will be describe later on referring to FIG. 4). As a result of reducing $\Delta V_{th}$, an excessive amount of charges Q is not stored in the floating gate 340 during a program or an erase operation, so that a high electric field is not formed in the tunnel oxide layer 330 and the interdielectric layer 350. Also, the amount of charges passing through the tunnel oxide layer 330 is reduced, so that the amount of electron traps generated in the tunnel oxide layer 330 is reduced. Thus, the reliability of a device can be enhanced.

Figure 4:
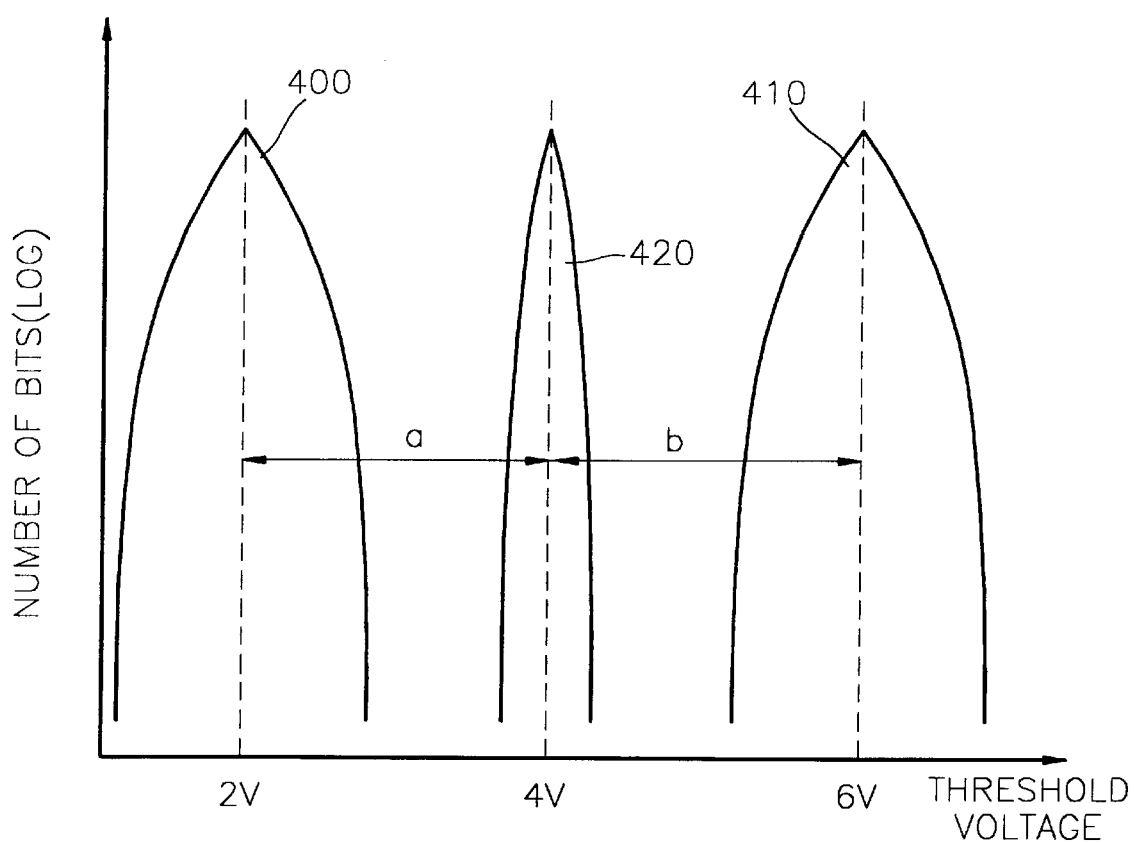
FIG. 4 is a graph showing distribution of the threshold voltages of a nonvolatile memory device according to an embodiment of the present invention.

In FIG. 4, Reference numerals 400, 410 and 420 denote the values of the threshold voltage of the erased state, the programmed state and the initial state, respectively. Reference character a denotes the difference between the threshold voltage of the initial state and the threshold voltage of the erased state, and reference character b denotes the difference between the threshold voltage of the initial state and the threshold voltage of the programmed state.

Referring to FIG. 4, so as to minimize $\Delta V_{th}$ an impurity is injected into a region where a channel is formed, so that the threshold voltage in the initial state is set such that a is the same as b. As a result, the threshold voltage of the initial state becomes a mean value between the threshold voltage of the programmed state and the threshold voltage of the erased state. Setting a and b as mentioned above, the amount of negative charge passing through the tunnel oxide layer 330 during the program operation is the same as the amount of positive charge passing through the tunnel oxide layer 330 during the erase operation. Thus, damage of the tunnel oxide layer 330 can be reduced. Also, as a result of increasing the threshold voltage of the initial state to the extent that a is the same as b, an amount of electrons injected into the floating gate 340 to program the memory cell can be reduced. Thus, in the case of the memory cell of the present invention, generation of electron traps can be reduced in comparison with the conventional memory cell, and deterioration in characteristics caused by electron traps in the tunnel oxide layer 330 can be decreased, to thereby increase the reliability of the memory cell.

Also, the amount of charges stored in the floating gate 340 during the program operation or the erase operation can be reduced, so that a high electric field is not formed during a read operation which is performed after the program or the erase operation, and in the state in which a voltage is not applied to the gate electrode. Thus, the amount of charges stored in the floating gate 340 is not easily changed according to external conditions, so that the reliability of the memory cell can be enhanced.

Figure 5:
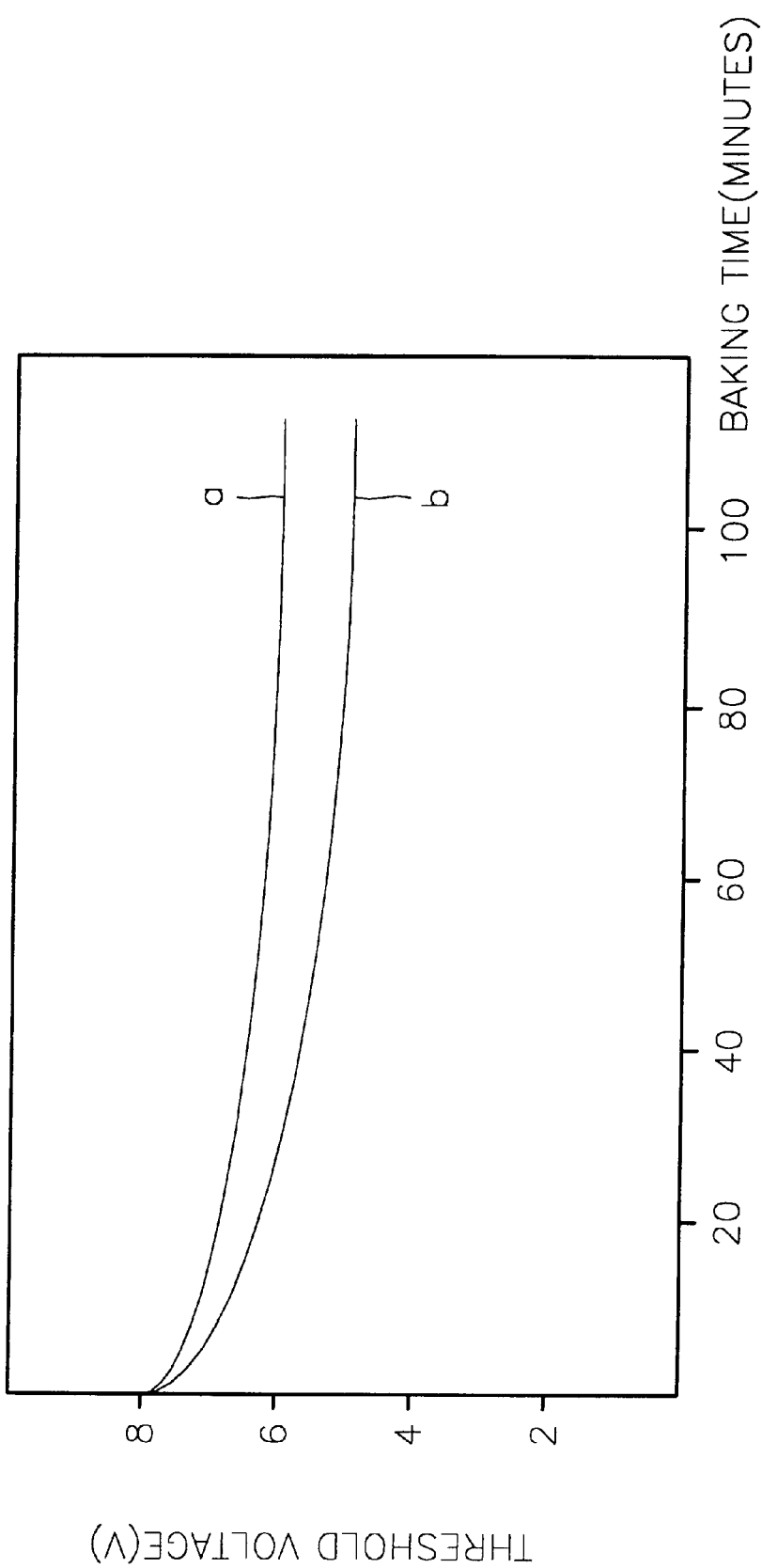
FIG. 5 is a graph showing the change of threshold voltages due to charge loss in a floating gate after baking NOR cells having various threshold voltages in the initial state at 300° C.

FIG. 5 is the graph showing the change of the threshold voltage in the programmed state, when baking two NOR cells having the different threshold voltage in the initial state at 300° C. Reference character a denotes a case in which the threshold voltage of the initial state is 4V, and reference character b denotes a case in which the threshold voltage of the initial state is 2V. The horizontal axis indicates baking time, and the vertical axis indicates the threshold voltage of the programmed state.

Referring to FIG. 5, it can be easily known that the threshold voltage of the programmed state reduces as the baking time increases. This is because the charges stored in the floating gate 340 are thermally emitted. Also, FIG. 5 is teaching that the lower the threshold voltage of the initial state is, the more charges stored in the floating gate 340 are thermally emitted during baking. As a result, the less is the threshold voltage of the initial state, the more reduced is the threshold voltage of the programed state through baking. Thus, as the threshold voltage of the initial state is higher, charge retention capability in the floating gate is enhanced to thereby increase the reliability of the device.

Embodiment 2

In a nonvolatile memory device, the threshold voltage of the initial state in which the floating gate 340 is electrically neutral is set by the same voltage as applied to a word line to read data stored in the nonvolatile memory device. An impurity is implanted into a region where a channel is formed to set the threshold voltage of the initial state to a desired voltage, to thereby form a nonvolatile memory device having a predetermined threshold voltage in the initial state. The second embodiment has the same effect as the first embodiment.

That is, in order to read data from a selected cell, voltages are applied to a gate electrode of the selected cell and a bit line connected to the selected cell. At this time, an erased cell has the tendencies of generating hot carriers due to the voltages applied during read operation and being programmed by the hot carriers. Also, an electric field is formed across the tunnel oxide of the programmed cell connected to a selected bit line and an unselected word line due to a voltage applied to the bit line, a voltage applied to the gate, and charges in the floating gate 340. As a result, the tendency that the electrons in the floating gate 340 are moved to the bit line junction appears. Thus, like in the conventional art, if the floating gate 340 in the programed state or the erased state is storing a large amount of charges, the above tendencies appear under some conditions for the read operation due to the tendency of the floating gate's moving to the neutral state. On the other hand, according to the present invention, the amount of charges stored in the floating gate 340 during the program operation is the same as that during the erase operation, to thereby suppress the tendencies as mentioned above.

Embodiment 3

Figure 6:
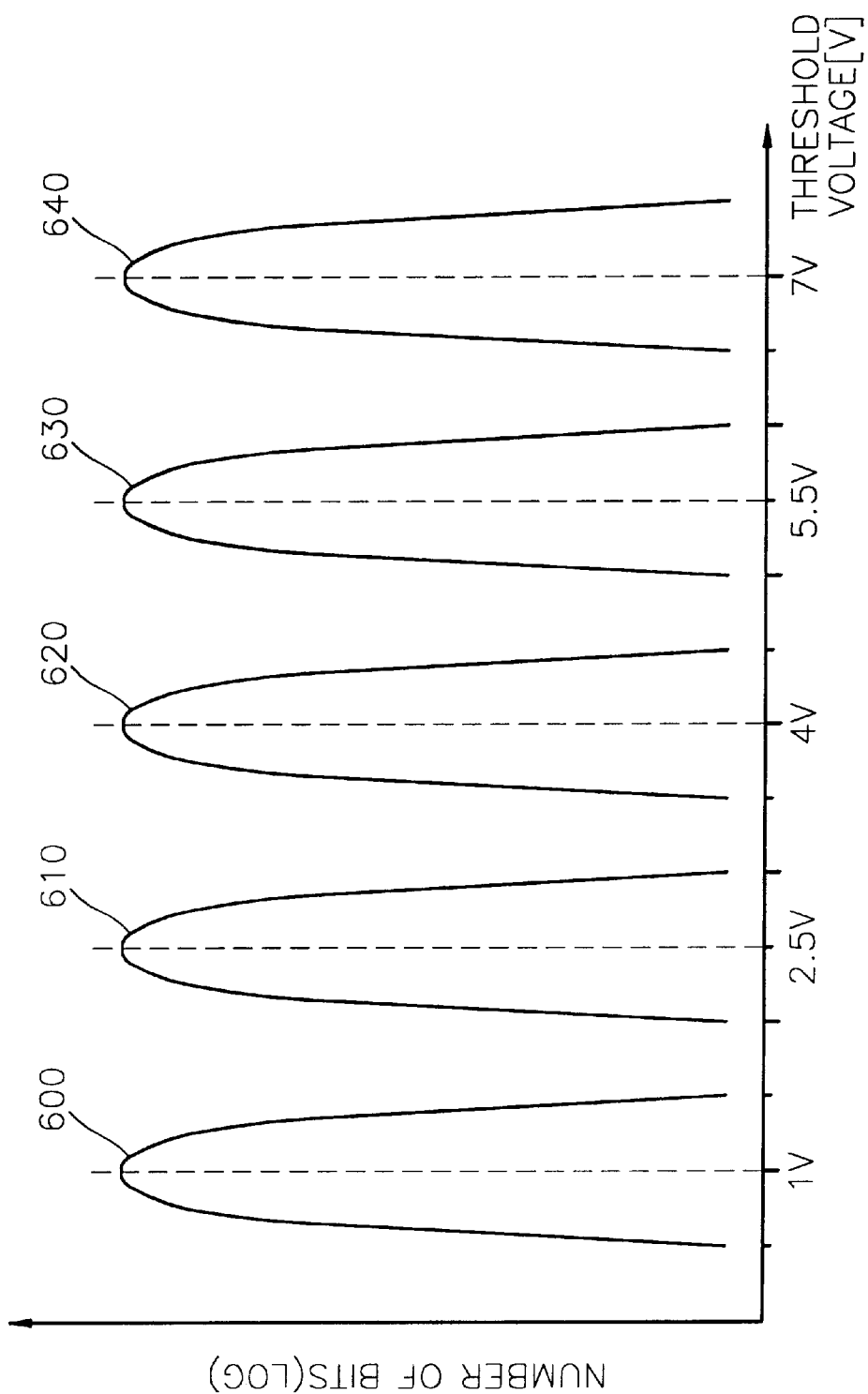
FIG. 6 is a graph showing distribution of the threshold voltages of a nonvolatile memory device according to another embodiment of the present invention.

One memory cell in the conventional art can be storing two data values of "0" and "1". However, in the case of a multi bit cell in the recent development, is capable of storing four or more datum in one cell. Referring to FIG. 6, the multi bit cell has an erased state 600, a first programmed state 610, a second programmed state 630 and a third programmed state 640, so that two or more data values can be stored in one cell. As a result, the multi bit cell can store more datum than the conventional memory cell.

FIG. 6 shows threshold voltages corresponding to the erased state 600, the first programmed state 610, the initial state 620, the second programmed state 630 and the third programmed state 640. At this time, preferably, the threshold voltage of the initial state which is electrically neutral, is a mean value of the threshold voltage of the erased state and the highest threshold voltage of the programmed states.

As described above, according to the nonvolatile memory device of the present invention, the threshold voltage of the initial state is set to a mean value of the threshold voltage of the programmed state and the threshold voltage of the erased state, so that the amount of charges passing through the tunnel oxide layer 330 during a program operation is the same as that during an erase operation, to thereby reduce generation of electron traps in the tunnel oxide layer 330. Also, the amount of charges stored in the floating gate 340 during a program or a erase operation is minimized, so that the electric field due to the charges stored in the floating gate 340 is reduced, to thereby suppress the decrease of the amount of the charges stored in the floating gate 340 resulting from external conditions. As a result, the reliability of the device can be enhanced.

What is claimed is:

1. A nonvolatile memory device comprising a gate electrode including a gate insulating layer, a floating gate, an interdielectric layer and a control gate, a source region and a drain region, wherein a threshold voltage of an initial state, in which the floating gate is electrically neutral, is set to a mean value between a threshold voltage of a programmed state and a threshold voltage of an erased state.

2. The nonvolatile memory device of claim 1, wherein the threshold voltage of the programmed state is 6 V, the threshold voltage of the erased state is 2V, and the threshold voltage of the initial state is 3.5~4.5V.

3. The nonvolatile memory device of claim 1, wherein the threshold voltage of the initial state is set to a desired value by an impurity implanted into a region where a channel is formed.

4. The nonvolatile memory device of claim 1, wherein the nonvolatile memory device is a flash memory.

5. The nonvolatile memory device of claim 1, wherein hot electrons are injected into the floating gate to program the nonvolatile memory device, and the electrons stored in the floating gate are tunneled to erase the nonvolatile memory device.

6. The nonvolatile memory device of claim 1, wherein the threshold voltage values of the programmed state, the erased state and the initial state are positive.

7. A nonvolatile memory device comprising a gate electrode including a gate insulating layer, a floating gate, an interdielectric layer and a control gate, a source region and a drain region, wherein the nonvolatile memory device has programmed states corresponding to two or more different threshold voltages, and an initial state, in which the floating gate is electrically neutral, corresponding to a mean value between a highest threshold voltage of the programmed states and a threshold voltage of an erased state.

8. The nonvolatile memory device of claim 7, wherein the threshold voltage values of the erased state, the initial state and the programmed state are positive.

* * * * *

UNITED STATES PATENT AND TRADEMARK OFFICE
CERTIFICATE OF CORRECTION

PATENT NO. : 6,347,053 B1 Page 1 of 1
APPLICATION NO. : 09/491840
DATED : February 12, 2002
INVENTOR(S) : Kim et al.

It is certified that error appears in the above-identified patent and that said Letters Patent is hereby corrected as shown below:

Column 2:
Line 55, after "in" delete "a" and insert therefor -- an --

Column 4:
Line 16, after "be" delete "describe" and insert therefor -- described --

Column 5:
Line 14, after "the" delete "programed" and insert therefor -- programmed --
Line 41, after "the" (second occurrence) delete "programmed" and insert therefor
-- programmed --

Signed and Sealed this

Eleventh Day of December, 2007

JON W. DUDAS
*Director of the United States Patent and Trademark Office*